United States Patent

Yuhya et al.

Patent Number: 5,731,271
Date of Patent: Mar. 24, 1998

[54] METHOD FOR PREPARING AN OXIDE SUPERCONDUCTING TAPE

[75] Inventors: Shigenori Yuhya, Amagasaki; Jiro Tsujino, Tokyo; Noriyuki Tatsumi, Tokyo; Yoh Shiohara, Tokyo, all of Japan

[73] Assignees: Mitsubishi Cable Industries, Ltd., Amagasaki; Hokkaido Electric Power Company, Inc., Hokkaido; International Superconductivity Technology Center, Tokyo, all of Japan

[21] Appl. No.: 717,363

[22] Filed: Sep. 25, 1996

Related U.S. Application Data

[63] Continuation of Ser. No. 357,514, Dec. 16, 1994, abandoned.

[30] Foreign Application Priority Data

Dec. 20, 1993 [JP] Japan ................................ 5-319889

[51] Int. Cl.[6] ........................................................ H01L 39/24
[52] U.S. Cl. .......................... 505/434; 505/430; 505/477; 505/740; 427/62; 427/255.5
[58] Field of Search .................................. 505/430, 434, 505/230, 740, 477; 427/62, 255.5; 118/730

[56] References Cited

U.S. PATENT DOCUMENTS 4,013,539   3/1977   Kuehnle .

FOREIGN PATENT DOCUMENTS 0 286 135   10/1988   European Pat. Off. .

OTHER PUBLICATIONS

Japanese Journal of Applied Physics, Part 2, (Letters), Jun. 1988, vol. 27, No. 6, Konaka et al., "Preparation of Y–Ba–Cu–O Superconducting Tape by Atmospheric Plasma Spraying", pp. L1092–L1093.

*Primary Examiner*—Roy V. King
*Attorney, Agent, or Firm*—Armstrong, Westerman, Hattori, McLeland & Naughton

[57] ABSTRACT

A method for growing a superconductive film, comprising:
(a) helically winding a tape substrate around the outer periphery of a cylindrical or columnar holder and
(b) growing a superconductive film on the surface of the tape substrate by plasma flash evaporation, while rotating the holder. According to the present invention, the heat contact between the holder and the tape substrate is stabilized and a high performance tape conductor can be obtained. In addition, degradation of superconductive performance possibly experienced, when the tape is used for a transmission cable or the like, can be lessened. Furthermore, the large area growth, which is the characteristic feature of plasma flash evaporation, is effectively utilized and production efficiency of a long tape conductor can be enhanced.

1 Claim, 4 Drawing Sheets

METHOD FOR PREPARING AN OXIDE SUPERCONDUCTING TAPE

This application is a continuation of application Ser. No. 08/357,514 filed Dec. 16, 1994, now abandoned.

TECHNICAL FIELD OF THE INVENTION

The present invention relates to a method for growing a superconductive film. More particularly, the present invention relates to a method for growing a superconductive film using a holder of a tape substrate for growing a superconductive film thereon by plasma flash evaporation.

BACKGROUND OF THE INVENTION

A plasma flash evaporation is a method for growing a film having a desired composition, which includes introducing a powder of a starting material into an ultrahigh temperature plasma, thereby subjecting the powder to evaporation and condensation. The method is characterized by high speed growth and large area growth. The tape substrate and the substrate holder are heated by the thermal plasma and a system for heating the substrate holder is not necessary.

FIG. 4 depicts a conventional method for growing a superconductive film by plasma flash evaporation. According to the conventional method, a tape substrate 12 is brought into contact with an upper surface 11a of a fixed plane holder 11, and the tape is run toward the direction of an arrow B in this contact state, while applying a thermal plasma P to grow a superconductive film on the tape substrate 12, whereby a tape conductor is obtained.

In the conventional method, however, a large area growth, which is the characteristic feature of the plasma flash evaporation, is not advantageously utilized, since the superconductive film is grown only on a part of the plane holder 11. In addition, since the tape substrate 12 runs on the upper surface 11a of the fixed plane holder 11, the heat contact between the holder 11 and the tape substrate 12 is unstable, and a high performance tape conductor is difficult to obtain.

A tape conductor having a superconductive film is mainly used for transmission cables and superconductive magnets. For applying the tape conductor for these uses, the tape conductor needs to be solenoidally wound. However, superconductors are known to markedly lose superconductive performance by tensile distortion and bending distortion. Therefore, the tape conductor produced by a conventional method is susceptible to degradation of superconductive performance, when it is wound solenoidally, due to the bending deformation developed in the superconductor.

Under the circumstances, the present invention aims at providing a holder of a tape substrate for growing a superconductive film, which permits effective utilization of the beneficial characteristics of the plasma flash evaporation; provides a high performance tape conductor by the stable heat contact between a tape substrate and the holder; and decreases degradation of superconductive performance potentially experienced when the tape conductor is used for a transmission cable and the like, and a method for growing a superconductive film.

SUMMARY OF THE INVENTION

The method of the present invention comprises helically winding a tape substrate on the outer periphery of the holder of the present invention and growing a superconductive film on the surface of the tape substrate by plasma flash evaporation while rotating the holder.

DETAILED DESCRIPTION OF THE INVENTION

According to the substrate holder (the holder of a tape substrate for growing a superconductive film is hereinafter referred to as the substrate holder) of the present invention, a tape substrate can be helically wound around the outer periphery of the holder, since the holder is columnar or cylindrical in shape, thus permitting effective utilization of the surface of the holder. Accordingly, the area exposed to the thermal plasma during plasma flash evaporation increases and the large area growth, which is the characteristic feature of plasma flash evaporation, can be effectively utilized, which in turn results in an improved production efficiency of a long tape conductor.

According to the method for growing a superconductive film of the present invention, moreover, the heat contact between the holder and the tape substrate is stable, since the tape substrate is helically wound around the outer periphery of the substrate holder of the present invention, and a superconductive film is formed on the surface of the tape substrate by plasma flash evaporation while rotating the holder, whereby a high performance tape conductor can be obtained. In addition, since a superconductive film is grown on the surface of the tape substrate solenoidally wound, degradation of superconductive performance, possibly experienced when the tape is used for a transmission cable or the like, can be lessened. Furthermore, the use of the substrate holder of the present invention results in effective utilization of the large area growth, which is the characteristic feature of plasma flash evaporation, and an enhanced production efficiency of a long tape conductor.

Figure 1:
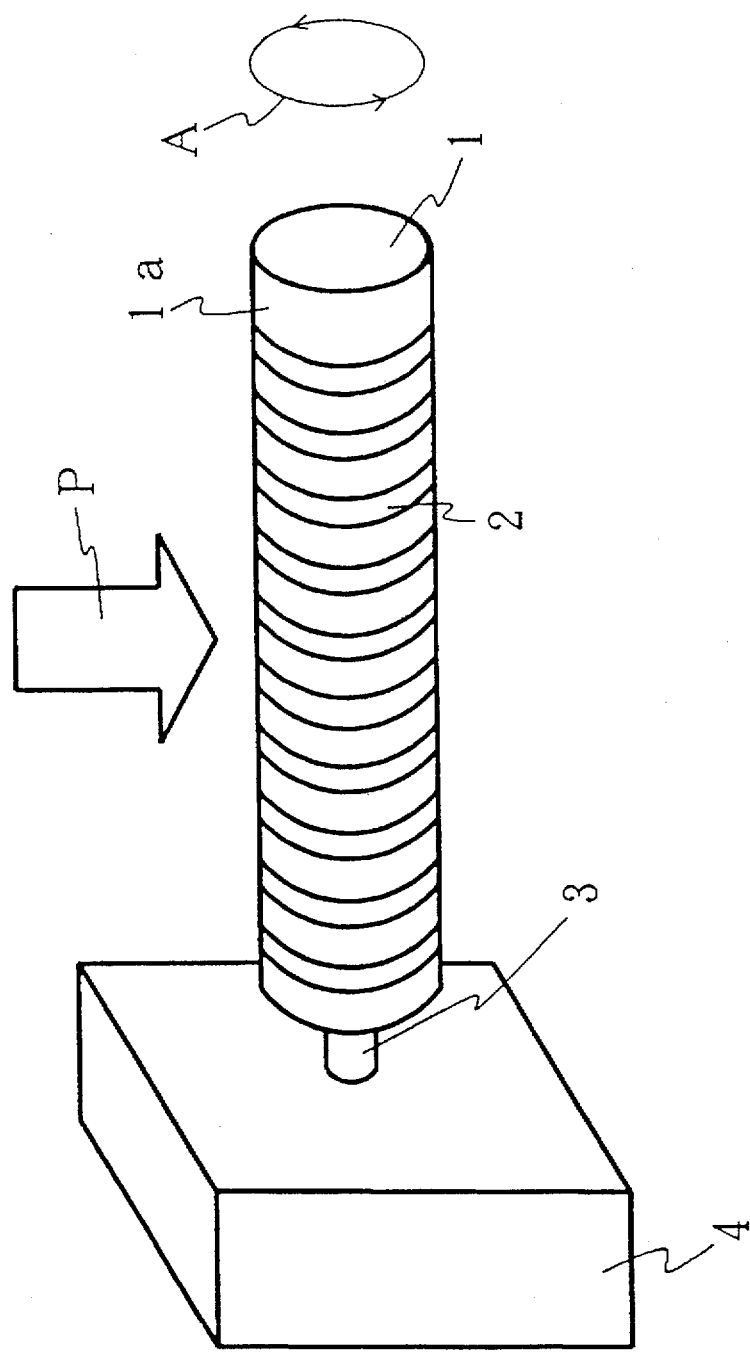
FIG. 1 shows one embodiment of the method for growing a superconductive film of the present invention.

FIG. 1 shows one embodiment of the method for growing a superconductive film of the present invention. In FIG. 1, a tape substrate 2 is helically wound around an outer periphery 1a of a columnar holder 1, which is one embodiment of the substrate holder of the present invention. The holder 1 is connected to a rotation drive means 4, such as a motor, via a rotation axis 3, and rotates toward the direction of an arrow A. A superconductive film is grown on the tape substrate 2 in a gas for growing a desired superconductive film, by heating with the thermal plasma P.

In the present invention, the shape of the holder 1 may be columnar or cylindrical with a hollow part therein. While the diameter of the holder 1 varies depending on the use of the tape conductor having a superconductive film formed thereon and the like, it is generally 10 mm–100 mm, preferably 20 mm–50 mm, and the entire length of the holder 1 is 50 mm–300 mm, preferably 70 mm–150 mm. The material of the holder 1 is a heat resistant metal, such as stainless steel and Hastelloy, or a ceramic such as alumina.

As the tape substrate 2, usable are platinum, alumina polycrystals, yttria-stabilized zirconia (YSZ) polycrystals, calcia-stabilized zirconia (CSZ) polycrystals and heat resistant metals covered with these. While the width of the tape substrate 2 varies depending on the use of the tape conductor and the like, it is generally 2 mm–20 mm, preferably 5 mm–10 mm.

For forming a superconductive film on the surface of the tape substrate 2, argon, oxygen and a starting material such as a superconductive oxide powder are introduced into a reaction chamber. Examples of the superconductive oxide powder include $YBa_2Cu_3Ox$, $Bi_2Sr_2CaCu_2Ox$ and $(Bi,Pb)_2Sr_2Ca_2Cu_3Ox$. A mixture of predetermined amounts of $CuO$, $Y_2O_3$, $BaCO_3$, $Bi_2O_3$, $SrCO_3$ $CaCO_3$ and $PbO$ may be also used.

Then, the holder 1 is applied with a high frequency electricity of 2 MHz–13.56 MHz, while rotating the holder 1 at 0.1 rpm–10 rpm under a gas pressure of 50 Torr–500 Torr.

When a long tape conductor usable for superconductive wire or current lead is manufactured, a means for delivering a tape substrate 2 and a means for winding up same may be set in the vicinity of the holder 1.

The tape conductor thus obtained can reduce degradation of superconductive performance, which may occur when the tape conductor is used for transmission cable, and the like. Even when the tape may be used in a linear state such as for a current lead, the degradation of superconductive performance is less, since the tape conductor is subject to compression distortion.

The present invention is described in more detail in the following by illustrative Example and Experimental Example, to which the invention is not limited.

EXAMPLE 1

A 10 mm wide YSZ polycrystal tape was helically wound around the outer periphery of a 25 mm diameter columnar holder, and a powder of $YBa_2Cu_3O_x$ was supplied under an environment of 200 Torr and argon gas/oxygen gas of 7/50 (volume ratio) to form a film at 600° C. holder temperature for 10 minutes. After forming the film, the holder was naturally cooled and the specimen was taken out when it became 100° C. or below.

EXPERIMENTAL EXAMPLE 1

Figure 2:
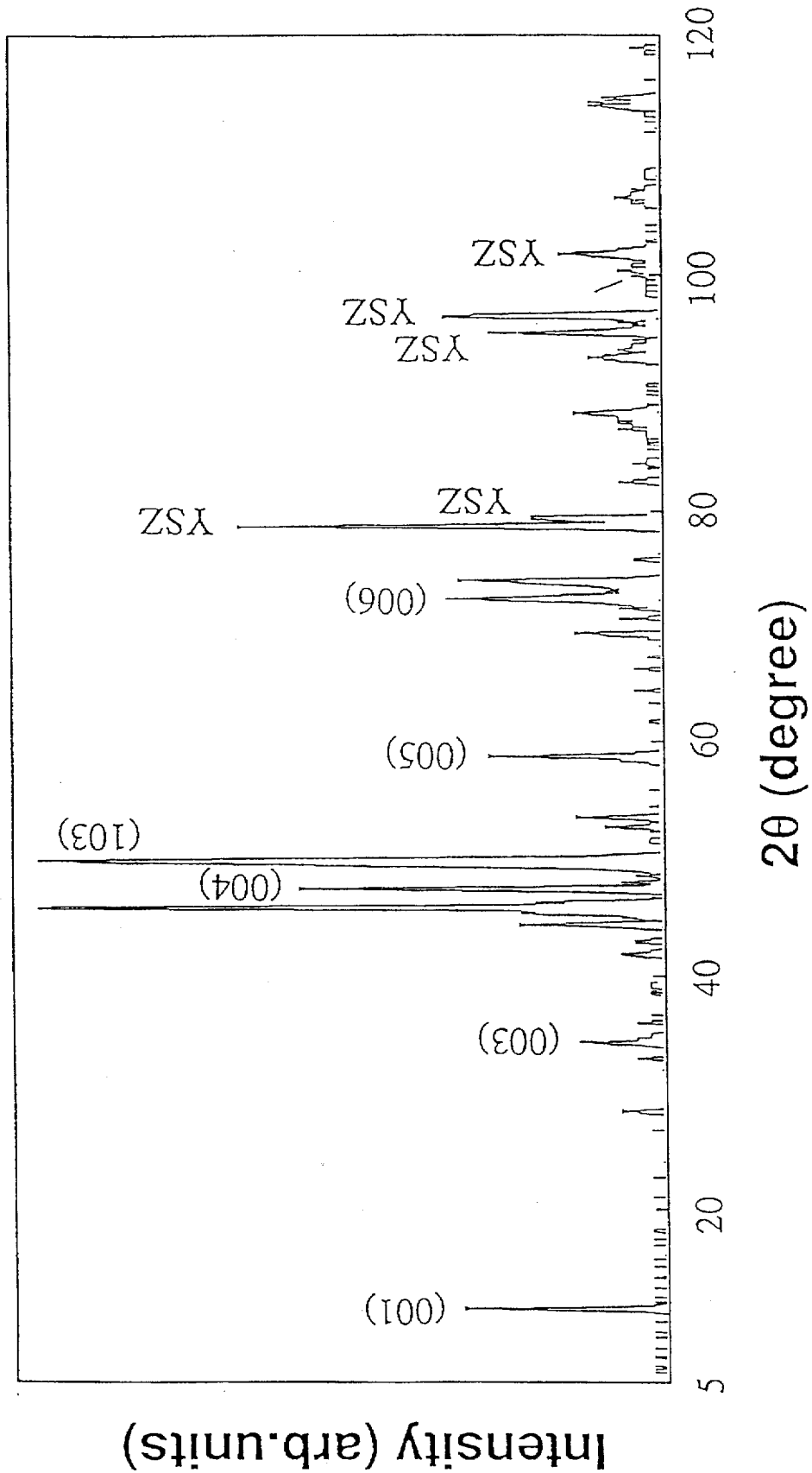
FIG. 2 shows the results of an X-ray diffraction of the tape conductor obtained in Example 1.
Figure 3:
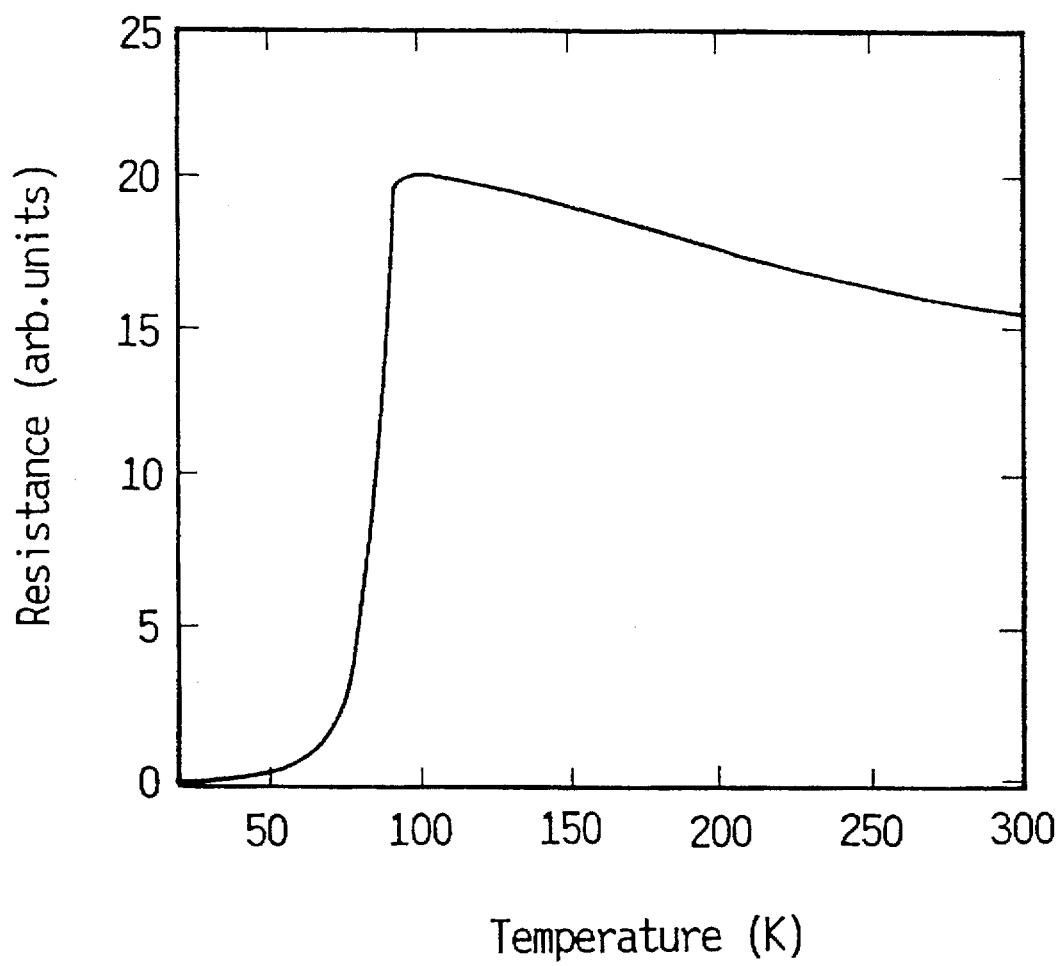
FIG. 3 shows superconductive transition temperature of the tape conductor obtained in Example 1.
Figure 4:
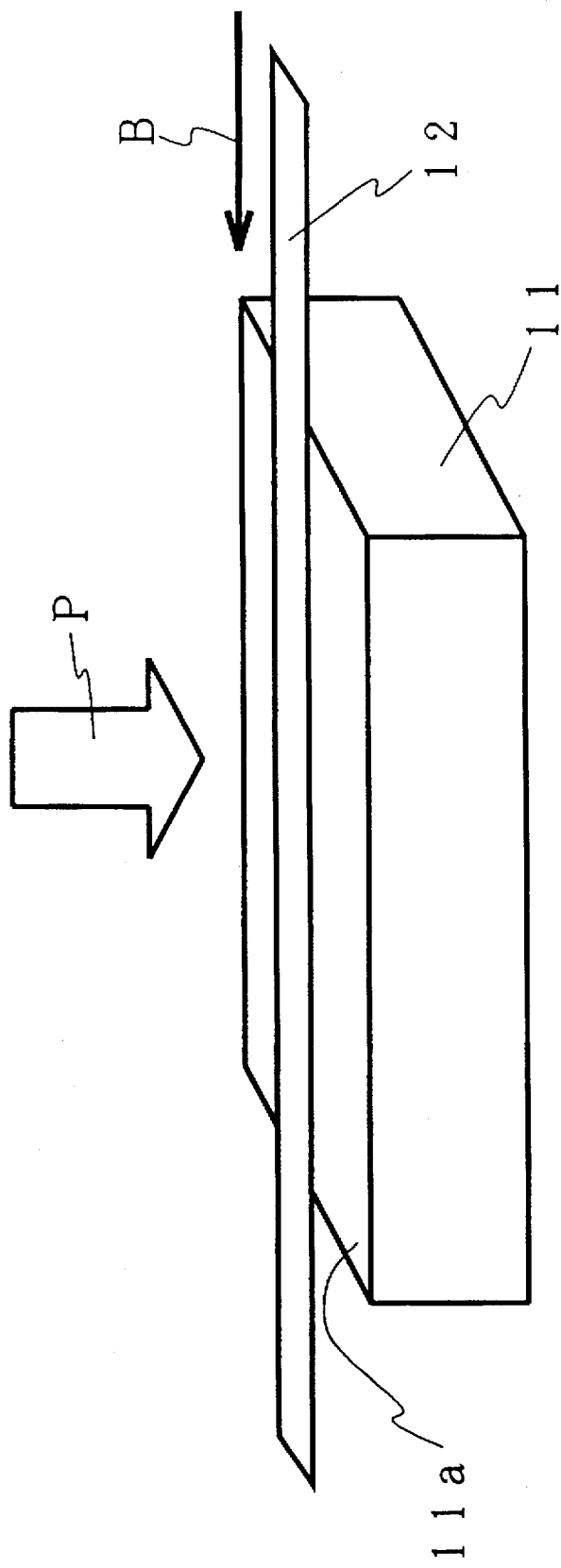
FIG. 4 shows a conventional method for growing a superconductive film by plasma flash evaporation.

The X-ray diffraction and superconductive transition temperature of the obtained tape conductor were determined, the results of which are shown in FIG. 2 and FIG. 3, respectively. The results of the X-ray diffraction as shown in FIG. 2 reveal the diffraction peak of the YSZ polycrystal and the peak of superconductor phase. Based on the resistance values shown in FIG. 3, it is known that the superconductive transition temperature is near 90 K.

According to the substrate holder of the present invention, the large area growth, which is the characteristic feature of plasma flash evaporation, can be effectively utilized and production efficiency of a long tape conductor can be enhanced.

According to the method for growing a superconductive film of the present invention, moreover, the heat contact between the holder and the tape substrate is stabilized and a high performance tape conductor can be, obtained. In addition, degradation of superconductive performance, possibly experienced when the tape is used for a transmission cable or the like, can be lessened. Furthermore, the large area growth, which is the characteristic feature of plasma flash evaporation, is effectively utilized and production efficiency of a long tape conductor can be enhanced.

What is claimed is:

1. A method for growing a superconductive oxide film, comprising:

(a) helically winding a tape substrate around the outer periphery of a cylindrical or columnar holder and (b) growing a superconductive oxide film on the surface of the tape substrate by plasma flash evaporation while rotating the holder at 0.1 rpm–10 rpm under a gas pressure of 50 Torr–500 Torr, wherein the holder is applied with a high frequency electricity of 2 MHz–13.56 MHz during growth of said superconductive oxide film.

\* \* \* \* \*